(12) United States Patent
Wolf et al.

(10) Patent No.: US 8,577,311 B2
(45) Date of Patent: Nov. 5, 2013

(54) PREDISTORTION OF AMPLIFIER INPUT SIGNALS

(75) Inventors: Norman Wolf, Berlin (DE); Jan-Erik Mueller, Ottobrunn (DE)

(73) Assignee: Intel Mobile Communications GmbH, Neubiberg (DE)

( * ) Notice: Subject to any disclaimer, the term of this patent is extended or adjusted under 35 U.S.C. 154(b) by 503 days.

(21) Appl. No.: 12/846,416

(22) Filed: Jul. 29, 2010

(65) Prior Publication Data

US 2011/0025414 A1 Feb. 3, 2011

Related U.S. Application Data

(60) Provisional application No. 61/230,569, filed on Jul. 31, 2009.

(51) Int. Cl.
 *H04B 1/04* (2006.01)
 *H04K 1/02* (2006.01)
 *H04L 25/03* (2006.01)
 *H04L 25/49* (2006.01)

(52) U.S. Cl.
 USPC ........................................ 455/114.3; 375/296

(58) Field of Classification Search
 USPC ............. 455/114.2, 114.3, 126, 127.1, 127.2, 455/127.3; 375/296, 297; 330/149
 See application file for complete search history.

(56) References Cited

U.S. PATENT DOCUMENTS

| 6,304,140 | B1 | 10/2001 | Thron et al. |
| 7,904,033 | B1 * | 3/2011 | Wright et al. ............... 455/114.2 |
| 2004/0252783 | A1 * | 12/2004 | Kim et al. ....................... 375/296 |
| 2005/0195919 | A1 * | 9/2005 | Cova .............................. 375/297 |
| 2009/0256630 | A1 * | 10/2009 | Brobston ........................ 330/2 |

* cited by examiner

*Primary Examiner* — Nguyen Vo
(74) *Attorney, Agent, or Firm* — Eschweiler & Associates, LLC

(57) ABSTRACT

Described herein are devices, methods, and techniques related to predistortion of amplifier signals based on an operating condition. Predistortion techniques are described that mitigate or eliminate the effects of variable operating conditions, including nonlinear effects, on amplified signals. Nonlinearities may be mitigated by compensating at a baseband signal prior to amplification, generally using scaling and a static characteristic that is valid for a broad range of operating conditions.

5 Claims, 13 Drawing Sheets

PREDISTORTION OF AMPLIFIER INPUT SIGNALS

PRIORITY CLAIM AND CROSS-REFERENCE TO RELATED APPLICATION

This application claims the benefit under 35 U.S.C. §119 (e)(1) of U.S. Provisional Application No. 61/230,569, filed Jul. 31, 2009, which is hereby incorporated by reference in its entirety.

BACKGROUND

There is a clear trend in the use of a terminal device (e.g. a mobile communication device) from voice-only communications to increased data transfer. In some cases, nonlinear systems may be utilized to accommodate a resulting increased demand on network capacity. For example, nonlinear systems may implement modulation methods with non-constant amplitudes to account for increased demand on network capacity. However, when these nonlinear systems are utilized, current consumption may increase, resulting in power being drained at a faster rate from a power supply of the terminal device.

Power amplifiers in a terminal device consume a considerable part of the total system power. It is desirable that at least some of the power amplifiers, such as a power amplifier of a transmitter section, are simultaneously efficient and linear in operation. This goal is generally difficult to achieve as power amplifiers tend to have their highest efficiency at maximum output power (i.e. operating in a saturation region). However, the output signal of the power amplifiers generally becomes increasingly nonlinear as the amplifiers go increasingly further into saturation.

In some instances, a power amplifier may provide a linear output signal when the output power of the power amplifier is reduced from the saturation region. However, the efficiency of the power amplifier may be reduced in these instances. Efficiency of the power amplifier is often important in terminal devices due to a relatively limited battery supply. In addition, optimizing efficiency of base station power amplifiers may also be important because power consumption may be a significant factor in their operating cost. Another technique to achieve a higher power output that is also linear is to increase the size of the power amplifier, although this results in a larger die size and usually higher cost.

To reduce cost, transmitters for terminal devices may include multiband, multimode solutions having one common broadband transmit path for low band and one common broadband transmit path for high band. With current technology, these lower cost implementations may need to be designed with considerable performance margins in order to fulfill all specifications. Consequently, these implementations may consume more current in comparison to designs having several narrow band paths in parallel.

Power amplifiers for mobile communication terminal devices typically use analog design techniques to improve the trade-off between linearity and efficiency. Several strategies are used which may also be combined. Analog design techniques are based on adjusting circuit characteristics which are sensitive to changes in operating conditions (e.g., temperature, battery voltage, frequency range, etc.) and may cause failure of the circuit if operating conditions change too much. Some analog design techniques compensate the amplitude and phase nonlinearities within a stage of a power amplifier by adjusting the bias, input impedance and/or output impedance. Further improvements may be achieved by designing the remaining nonlinearities of the individual stages to be opposed to each other, such that they cancel each other in a multi stage power amplifier. In this way, maximum linear power output and efficiency may be increased.

However, there is a clear trend among terminal component manufacturers to strive for higher and higher functional integration on a single silicon die, and towards single chip radios which may include the power amplifier; but analog design techniques are of limited use for modern scaled nanometer (nm) CMOS and BiCMOS technologies. In particular, standard nanometer CMOS and BiCMOS technologies typically have low breakdown voltage characteristics and strong device nonlinearities. In addition, analog design techniques may also be limited with respect to the broad band, multiple bands, and multiple standards covering currently developed terminal solutions.

Compared to previous analog linearization techniques, digital predistortion shows very good adaptability to changing operating conditions. In some cases, digital predistortion is utilized in base station power amplifier systems and are optimized for very high linearity. However, the closed loop systems used in base station power amplifiers are very complex and costly. Thus, the closed loop digital predistortion techniques used for base station power amplifiers cannot be easily adapted to mobile terminal devices. Additionally, some attempts to use digital predistortion in terminal device transmitters utilizing open loop configurations, which are configurations where output signal feedback is not used, failed mainly due to the impact of complex operating conditions and sample variations on system characteristics and the high calibration effort required.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Figure 1A:
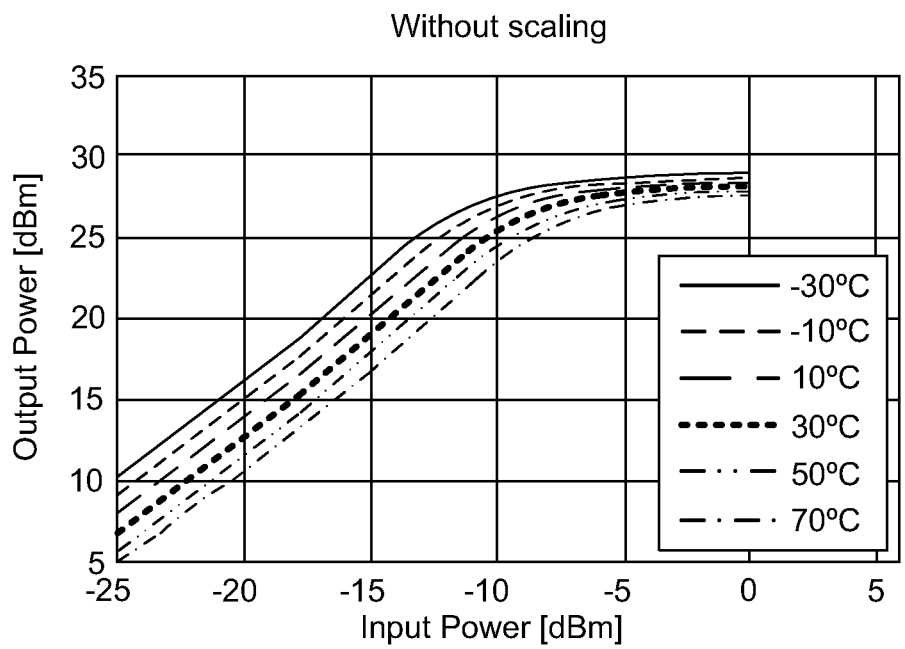
FIGS. 1A and 1B are exemplary graphs showing small signal output power gain for AM-AM characteristics, without and with scaling, respectively.

Predistortion techniques are described that mitigate, if not eliminate the effects of variable operating conditions, including nonlinear effects, on amplified signals. Nonlinearities may be mitigated by compensating at a baseband signal prior to amplification. According to one implementation disclosed, a predistortion component is configured to perform predistortion on a baseband signal using a static characteristic that is valid for a broad range of operating conditions. According to another implementation, the static characteristic is scaled according to the operating conditions as part of the predistortion.

Overview

This disclosure describes digital predistortion techniques that are feasible for use in mobile communications devices. According to certain implementations described in this disclosure, simple, low cost, low current consuming, and reliable digital open loop predistortion techniques (meaning techniques not employing feedback of the output signal) with low calibration effort enable new levels of performance and cost for linear and efficient transmitters. These implementations take full advantage of the capabilities of nanometer scaled complementary metal-oxide-semiconductor (CMOS) technology.

The concepts disclosed herein mitigate, if not eliminate the effects of variable operating conditions as a crucial disturbing factor for digital predistortion systems. While the disclosure herein is described in terms of digital predistortion systems, this is for ease of discussion and does not preclude other predistortion systems. In alternate implementations, analog predistortion systems or mixed analog and digital predistortion systems are also used. Further, the techniques, methods, and systems disclosed herein may be implemented with respect to digital and/or analog pre-modulated signals.

Nonlinearities in the output of amplifiers in transmitter circuits, especially those based on the use of nanometer scaled CMOS technology, may be observed under certain operating conditions (e.g., temperature, operating frequency, etc.). This is more apparent as amplifier output levels increase. The nonlinearities may be mitigated by compensating at the input signal prior to modulation and/or amplification. In some implementations, compensation may include predistortion of the input signal, including predistortion of the magnitude and/or the phase of the signal. Different predistortion techniques may be applied depending on the operating conditions and the resulting nonlinearities.

Most, if not all, operating condition changes that can be described by partly or fully scaled nonlinear characteristics may be compensated for by predistortion techniques. Based on these concepts, predistortion may be performed using a single static nonlinear characteristic (or function), generally in combination with scaling, to mitigate the effects of changing operating conditions. In some implementations, mitigation of nonlinear behavior using the described techniques may ease calibration efforts.

Scaling Concepts

Scaling concepts, including the derivation of a single static nonlinear characteristic or function as discussed above, may be better understood when discussing them in terms of relationships between an input signal and the output signal of an amplifier. In general, predistortion systems operating with static Amplitude Modulation-Amplitude Modulation (AM-AM) and Amplitude Modulation-Phase Modulation (AM-PM) characteristics are valid for one set of operating conditions (e.g., temperature, supply voltage, operating frequency, load condition, bias setting, and so forth). If one or more of these conditions change, the linearity of the system may decrease, that is, the nonlinear behavior increases. Thus, a change of operating conditions can lead to a scaling of nonlinear AM-AM and AM-PM characteristics (see FIGS. 1A and 3A).

Figure 1B:
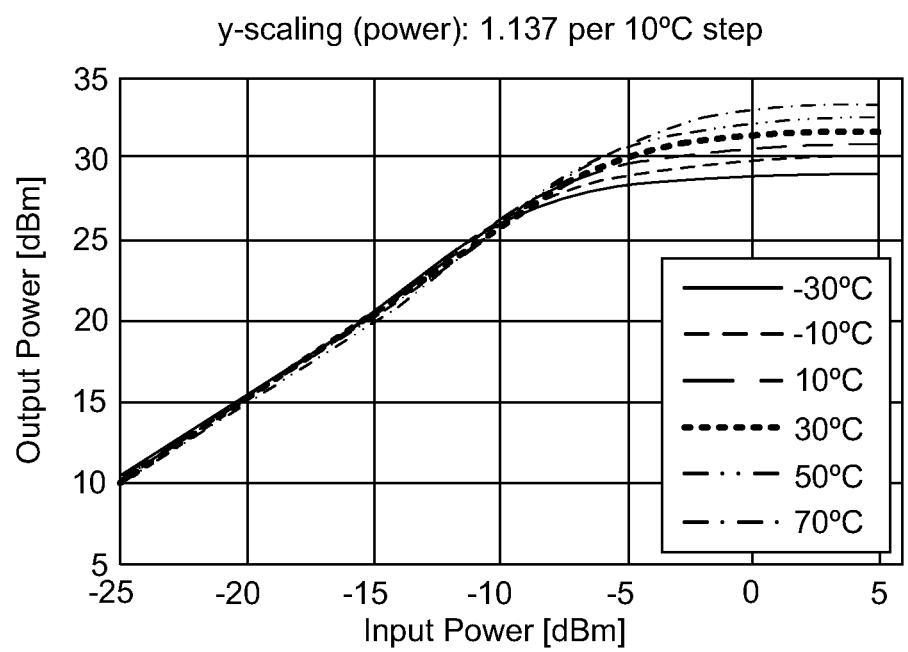
Figure 2A:
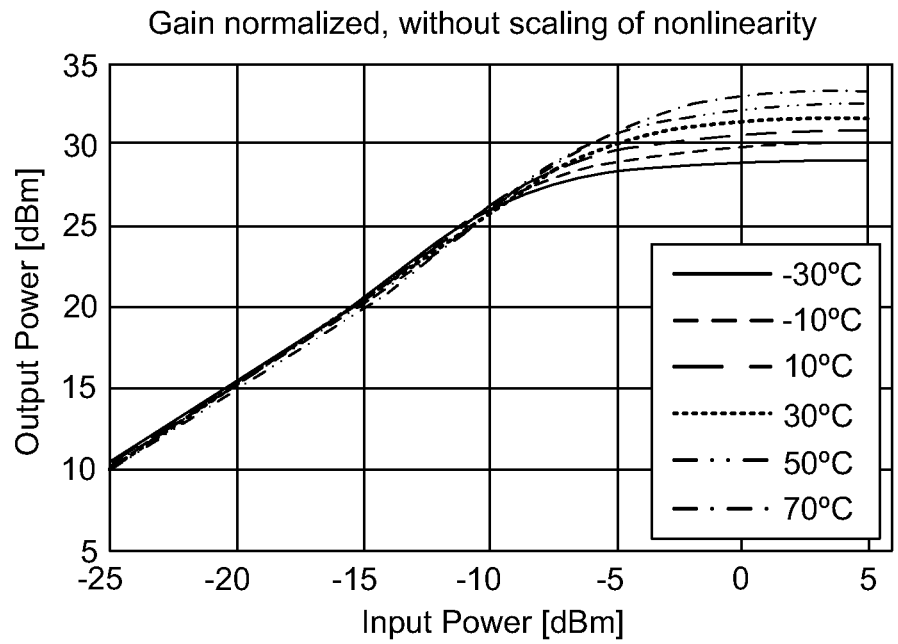
FIGS. 2A and 2B are exemplary graphs showing gain normalized AM-AM characteristics without and with scaling of nonlinearity, respectively.
Figure 2B:
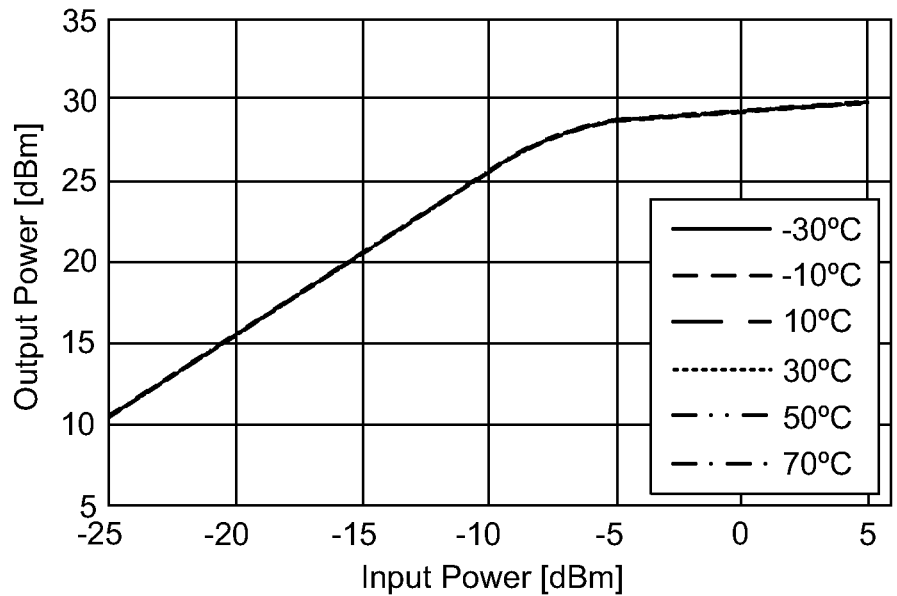
Figure 3A:
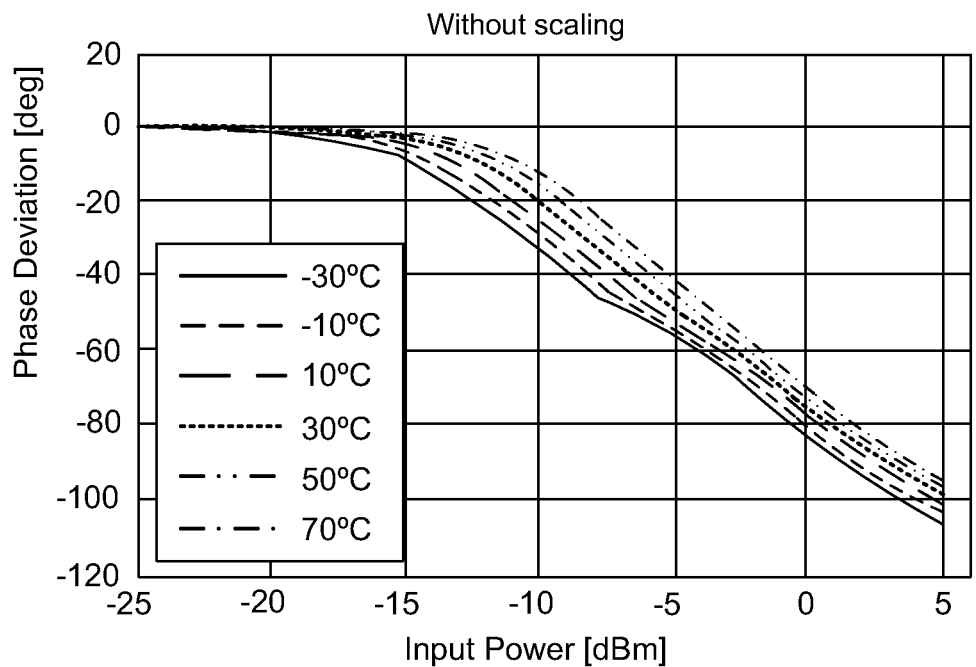
FIGS. 3A and 3B are exemplary graphs showing AM-PM curves without and with scaling of nonlinearity, respectively.
Figure 3B:
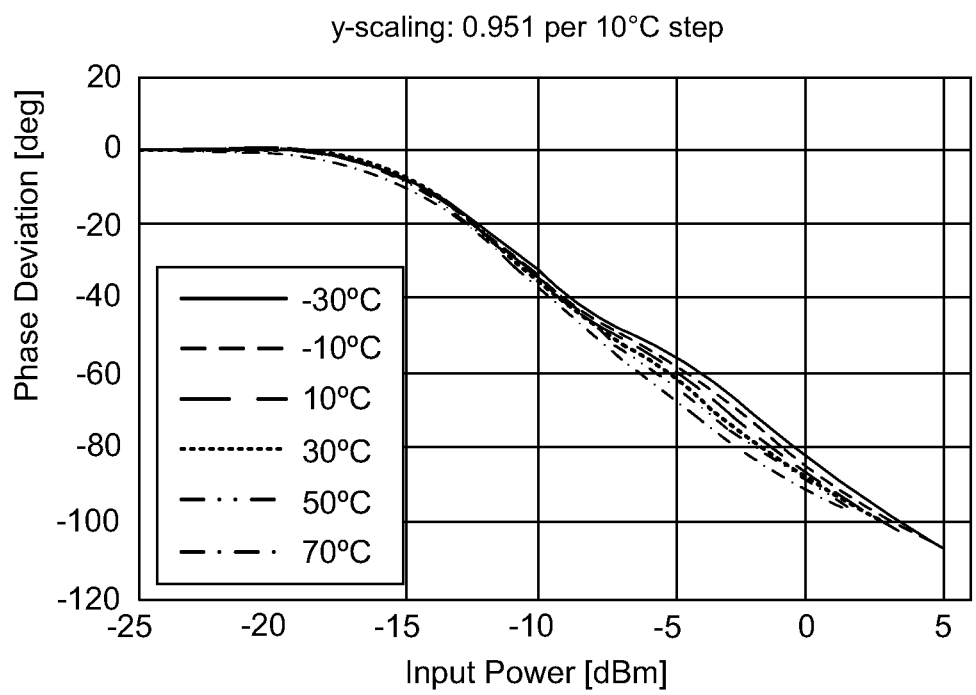

However, as a result of applying a combination of scaling factors to the amplifier output, the nonlinear AM-AM and AM-PM characteristics may be normalized (see FIGS. 1B, 2B, and 3B). Accordingly, characteristics at different nonlinear operating conditions can be mapped to a resulting (representative) single nonlinear function, which is valid for a particular operating condition, such as temperature, operating frequency, bias, and the like.

A scaling of nonlinear AM-AM and AM-PM characteristics at different operating conditions can lead to one single nonlinear characteristic. As a result, this single nonlinear characteristic can be used to calculate a nonlinear characteristic for a specific operating condition by applying one or more determined scaling factors. The scaling concept may be illustrated, for example, in a scenario where operating temperature is an important variable operating condition. FIGS. 1A through 3B illustrate this scenario. The impact of operating temperature change (or other operating condition changes) can be described by two separate effects related to the AM-AM characteristics: 1) Scaling of small signal output power gain (scaling of a linear or constant gain region of an output power curve), and 2) Scaling of nonlinearities (scaling of a nonlinear region of the power curve), which also may impact scaling of phase characteristics.

In this example scenario, changes in temperature lead to amplifier output curves with a similar nonlinear shape when viewed on a logarithmic scale, but scaled relative to each other based on the changes to the operating temperature.

Scaling of Small Signal Output Power Gain

FIGS. 1A and 1B are exemplary graphs illustrating the effect of scaling small signal output power gain for AM-AM characteristics. The graphs, plotted on a logarithmic scale, show the nonlinear effects of changing operating temperature on amplifier output power. The graphs also show (see FIG. 1B) illustrative results of scaling the output power, according to one example.

The graph of FIG. 1A illustrates several power curves showing output power versus input power, at incremental changes in operating temperature. The graph shows a general decrease in output power for a corresponding input power as operating temperature increases. The graph also shows that the power curves are generally the same shape, but are scaled with respect to each other when viewed on a logarithmic plot. For example, in the linear (constant gain) portion of the power curves (approximately −25 dBm to −10 dBm), the output power decreases regularly, by about 1 dB for the same input power, for every 20° C. increase in operating temperature.

The graph of FIG. 1B illustrates the power curves of output power versus input power, at the same incremental changes in operating temperature, but with the output power scaled. In the example illustrated, the output power is scaled in the y-direction by a factor of 1.137 for each 10° C. step. With the scaling factor applied to the output power, the linear (constant gain) portion of the output power curves line up (the power curves are normalized) as each plot is shifted in the y-direction on the graph by the scaling factor. Accordingly, a single curve is sufficient to represent the constant gain region output power characteristics resulting from changes in operating temperature, when the curve is scaled by a corresponding scaling factor. In some implementations, a scaling factor may be calculated using a logarithmic function, as will be discussed in a later section.

Scaling of Nonlinearities

One or more additional scaling factors may be determined (and applied) for all values of a varying operating condition to normalize the entire non-linear power curve. FIGS. 2A and 2B are exemplary graphs showing gain normalized AM-AM characteristics without and with scaling of nonlinearity, respectively. The graphs are a continuation of FIGS. 1A and 1B, illustrating the nonlinear effects of changing operating temperature on amplifier output power. The graphs also show (see FIG. 2B) example results of scaling the nonlinear portion of the output power curves, according to the example illustration.

The graph of FIG. 2A illustrates the several power curves of FIG. 1B, where the impact to the linear or constant gain portion of each of the curves has been mitigated by scaling. The graph of FIG. 2A shows that the nonlinear portion of the power curves (approximately −10 dBm to 5 dBm) still requires mitigation to correct the effects of changes in operating temperature.

The graph of FIG. 2B illustrates the power curves of output power versus input power, at the same incremental changes in operating temperature, but with the curves further scaled beyond that shown in FIG. 1B. In the example illustrated in FIG. 2B, the power curves are further scaled equally in the x and y directions by a factor of 0.951 for each 10° C. step. With the additional scaling factor applied to the power curves, the power curves line up (are normalized) throughout the linear and nonlinear regions of the curves. Accordingly, a single curve is sufficient to represent output power characteristics resulting from changes in operating temperature, when the curve is scaled by corresponding scaling factors (the scaling factors being based on the current operating condition).

Scaling of Phase Deviation

FIGS. 3A and 3B are exemplary graphs showing gain normalized AM-PM characteristics without and with scaling of nonlinearity, respectively. The graphs, also plotted on a logarithmic scale, illustrate the nonlinear effects of changing operating temperature on amplifier output phase deviation. The graphs also show (see FIG. 3B) example results of scaling the phase deviation of the output curves, according to the example illustration.

The graph of FIG. 3A illustrates several phase deviation output curves associated with the example discussed with reference to FIGS. 1A, 1B, 2A and 2B. The graph of FIG. 3A shows the phase deviation of the output requires mitigation to correct the effects of changes in operating temperature. The graph shows a general increase in phase deviation for a corresponding input power as operating temperature increases.

The graph of FIG. 3B illustrates the curves of phase deviation versus input power, at the same incremental changes in operating temperature, but with the curves scaled. In the example illustrated in FIG. 3B, the phase curves are scaled in the x direction by a factor of 0.951 for each 10° C. step, which is the same scaling factor used with reference to FIG. 2B. With the scaling factor applied to the phase curves, the phase curves generally line up (are normalized) throughout the linear and nonlinear regions of the curves. Accordingly, a single curve is sufficient to represent phase deviation characteristics resulting from changes in operating temperature, when the curve is scaled by a corresponding scaling factor.

It should be noted that the example discussed with reference to the illustrations in FIGS. 1A through 3B regarding operating temperature change illustrate only one example of using scaling to mitigate nonlinear characteristics resulting from changes in operating conditions. In alternate implementations, scaling techniques are used to mitigate nonlinear characteristics resulting from other changes in operating conditions, including changes in operating frequency, supply voltage, load conditions, bias, and the like.

In situations where the scaling follows a logarithmic rule, as shown for the temperature dependent graphs in FIGS. 1A, 1B, 2A, 2B, 3A, and 3B, then all scaling factors can be described by a single constant number. In other implementations, other rules which allow mapping using one or more constants may be used. Such rules are not necessary, but may be used for simplification of alternate implementations of predistortion systems.

Based on the above described concepts, predistortion may be performed on a baseband signal using a single static non-linear characteristic (or function), generally in combination with scaling, to mitigate the effects of changing operating conditions. In one example, a system may be implemented to predistort a baseband signal according to the above described concepts prior to the baseband signal being amplified, modulated, and transmitted by a communication device (e.g., terminal, base station, etc.). Predistorting the baseband signal may result in an output signal, with the nonlinear effects of the operating condition changes mitigated or eliminated. Predistortion methods described herein may be used to mitigate the effects of changing operating conditions in various implementations, as discussed below.

Example Predistortion System

FIGS. 1A through 3B illustrate one example of techniques that may be applied to mitigate the nonlinear effects of changing operating conditions on an amplifier output signal. FIGS. 1A through 3B show that nonlinear effects on the output signals of an amplifier may be mitigated by application of a combination of scaling functions to the output signals. Accordingly, systems, methods, and techniques are described herein, with respect to FIGS. 4-13, whereby nonlinear effects on the output signals of an amplifier may be mitigated by application of one or more predistortion techniques (generally including scaling functions as described above with reference to FIGS. 1A through 3B) to the baseband signal. Thus, predistorting the baseband signal may mitigate or eliminate the nonlinear effects of changing operating conditions on the corresponding output signal.

Figure 4:
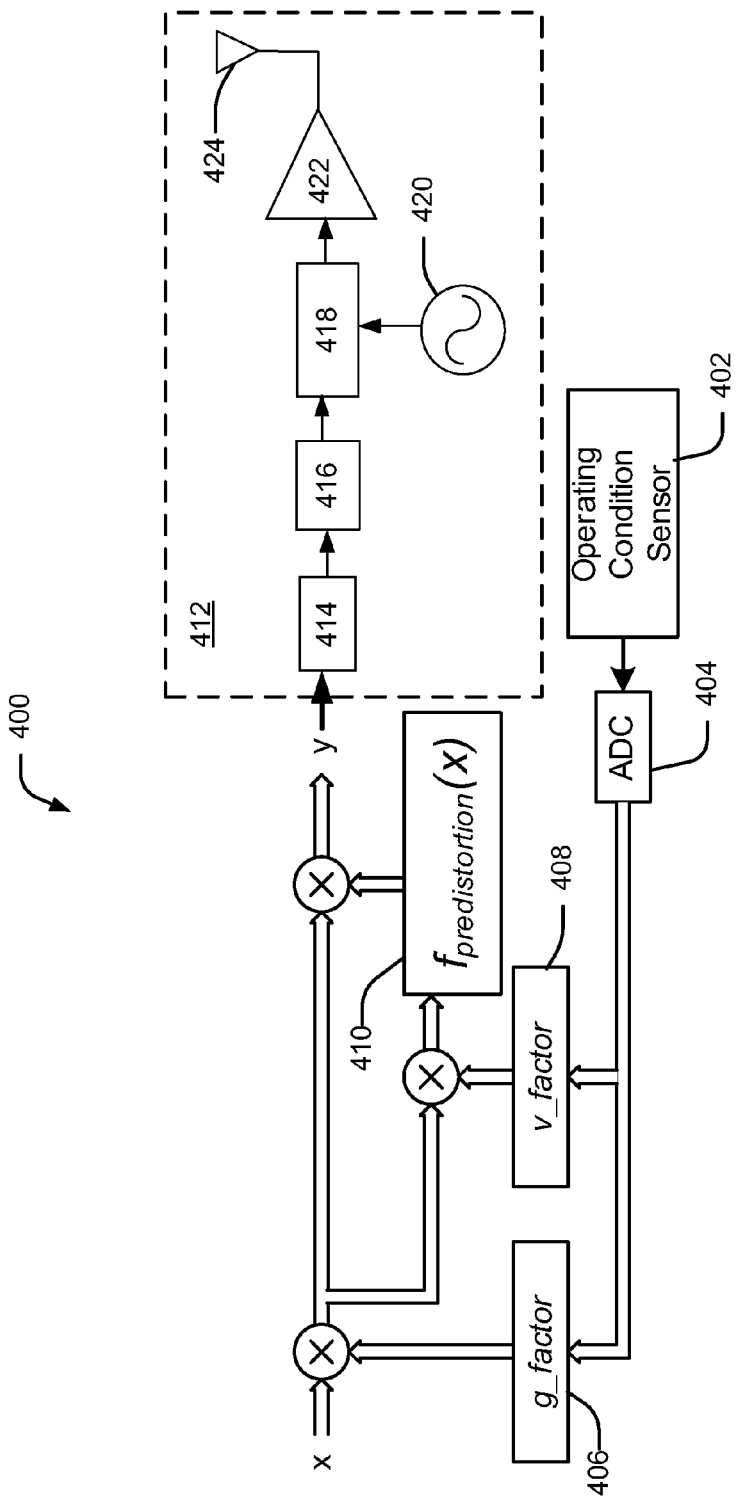
FIG. 4 is a block schematic illustrating compensation of the operating conditions in a gain based predistortion system.

FIG. 4 illustrates a block schematic of a representative system using predistortion techniques in accordance with the concepts discussed above. The representative system 400 is illustrated as an open loop system, meaning an output signal is not fed back into an input of the system. However, in alternate implementations that are within the scope of the disclosure, the representative system 400 may also be implemented as a closed loop system, or implemented with one or more feedback loops that feed an output signal to various portions of the system.

In some implementations, the representative system 400 of FIG. 4 may be implemented as an electronic apparatus or the like (e.g., integrated circuit, etc.). For example, the system 400 may be implemented as a transmitter system of a terminal device. In particular, the system 400 may be implemented as a component of a transceiver of a terminal device. In other implementations, the system 400 may be implemented in combinations of hardware and firmware and/or software. Further implementations of the system 400 are contemplated, and described in later sections.

As shown above with reference to FIGS. 1A through 3B, scalability may be utilized to map the related impacts of changing operating conditions on an amplifier output to a single resultant static predistortion characteristic. System 400 of FIG. 4 illustrates the application of an example single static predistortion characteristic, in combination with scaling, to a baseband signal, such that the impacts of changing operating conditions on the amplifier output signal are mitigated. The example of FIG. 4 is described based on temperature changes. However, the example can be similarly used for other operating condition impacts if the discussed scaling properties are fulfilled.

The system 400 of FIG. 4 is shown receiving an input signal x. Operating condition sensor 402 (e.g., temperature sensor, supply voltage level sensor, bias level detector, etc.) detects changes to the operating conditions of the system 400, and sends a signal (by way of analog to digital converter (ADC) 404) that produces a gain correction g_factor 406 and a nonlinearity correction v_factor 408 for the system 400. The signal sent by the operating condition sensor 402 may be a constant multiplier or the like, depending on the implementation. In an alternate implementation, gain correction g_factor 406 and nonlinearity correction v_factor 408 are determined based on pre-knowledge of the operating conditions (e.g., knowledge of the duty cycle of the input signal x). In other implementations, gain correction g_factor 406 and nonlinearity correction v_factor 408 may be determined by some other means (e.g., other input devices, predetermination, by design, etc.). In some implementations, gain correction g_factor 406 and nonlinearity correction v_factor 408 may be calculated using a processor. Accordingly, gain correction g_factor 406 and nonlinearity correction v_factor 408 may be stored in a memory storage device as described below, or another data storage device or mechanism.

The g_factor 406 and the v_factor 408 are applied to the input signal x, to scale the small signal gain of the input signal x and provide additional scaling of the predistortion values or function, respectively. This may be analogous to the scaling described with reference to FIGS. 1B, 2B, and 3B. While the scaling described with reference to FIGS. 1B, 2B, and 3B were performed on the output signal directly, here g_factor 406 and v_factor 408 (in combination with the static predistortion function 410, discussed further below) are applied to the input signal x. The additional scaling provided by v_factor 408 leads to a predistortion function related to the operating condition detected by the operating condition sensor 402 (or known due to pre-knowledge of the operating conditions, predetermination, etc.).

Determining a single static nonlinear characteristic for a particular operating condition, such as a given temperature, allows determination of the nonlinear characteristic or function at other temperatures. The static predistortion function 410 is calculated from the static nonlinear characteristic or function for the particular operating condition (here temperature impact). Thus, the mathematically described predistortion function 410, which acts as an address or an input of the predistortion function, can be applied to the previously scaled input x to mitigate the effects of the nonlinear characteristic, prior to modulation and transmission of the signal. The static predistortion function 410 is scaled according to the operating conditions, and applied to the input x.

For example, the system 400 may perform predistortion on the input signal x as described above based on previously (or currently) detected or known operating conditions of the system 400. The system may then detect a change in the operating conditions using operating condition sensor 402, for example (such as a change in operating temperature), and may compare new operating conditions to the previous operating conditions. The system 400 may then modify a property of the input signal x based on the static predistortion function 410 and the change of the operating conditions.

The predistortion function 410, may be scaled according to the operating conditions, prior to being applied to the input x. Scaling the predistortion function 410 may include scaling the input to the predistortion function 410, as shown in FIG. 4. In other implementations, as described below, scaling the predistortion function 410 may include scaling addresses to a look up table (LUT) that represents the static characteristic (function), the use of a feedback loop, and the like.

The predistortion function 410 is applied to the input signal x to produce a predistorted signal y. In an example implementation, the output of the predistortion function 410 is multiplied to a component of the input signal x, producing the predistorted signal y. In alternate implementations, the output of the predistortion function 410 is applied to the input signal x by other techniques to produce the predistorted signal y (e.g., with a mixer, a combiner, etc.).

The predistorted signal y is provided to the modulation and transmission stage 412. The modulation and transmission stage 412 is illustrated in FIG. 4 with general components 414-424, which may provide, for example, digital to analog conversion (414), low pass filtering (416), modulation (418 and 420), amplification (422), and transmission (424) of the modulated signal. These components 414-424 are not specific to an implementation of predistortion techniques, and any similar components may be used for a modulation and transmission stage 412. In alternate implementations, fewer components or additional components may be used in the modulation and transmission stage 412.

Thus, by predistorting the input signal x in the system 400, using techniques including those discussed with reference to FIGS. 1A through 3B, nonlinear effects of changing operating conditions may be mitigated or eliminated from the modulated output signal that is transmitted from the modulation and transmission stage 412.

Example Implementations

Mathematically Described Predistortion Systems

In one implementation, described with reference to FIG. 4, a polynomial based predistortion system implements the predistortion function 410 discussed above. In alternate implementations, Volterra-series models and similarly derived models are implemented in a similar manner as polynomials.

Generally, polynomials describing behavior of a transmitter component may be given by:

$$y = \sum_{n=0}^{N} a_n(B) x^n$$

Where $a_n$ are the coefficients of the polynomial and B represents the operating conditions.

When scalability is applied, the coefficients $a_n$ may be given by:

$$a_n(B) = \frac{x\_scale(B)^n}{y\_scale(B)} a_n$$

Using this relationship leads to:

$$y \cdot y\_scale(B) = \sum_{n=0}^{N} a_n(x \cdot x\_scale(B))^n$$

In some cases, the constant component $a_0$ may be negligible and so it holds:

$$y = \frac{x\_scale(B)}{y\_scale(B)} a_1 x + \frac{1}{y\_scale(B)} \sum_{n=2}^{N} a_n(x \cdot x\_scale(B))^n \text{ with } a_0 = 0$$

The nonlinearity factor v_factor represents the shift parallel to the x-axis:

$$v\_factor(B) = x\_scale(B)$$

The small signal gain factor g_factor is given by:

$$g\_factor(B) = \frac{y\_scale(B)}{x\_scale(B)}$$

Referring again to the system 400 shown in FIG. 4, let $f_{PA}$ represent the nonlinear power amplifier characteristics and $f_{PAnormalized} = f_{PA}/a_1$ represent the power amplifier characteristics normalized to unity gain. Thus, the predistortion function 410 is described as:

$$f_{predistortion}(x) = \frac{f_{PAnormalized}^{-1}(x)}{x}.$$

In an alternate implementation, the factors for scaling small signal gain (g_factor 406) and nonlinearity (v_factor 408) may be calculated using a natural logarithmic function. For a given power amplifier, it is possible to determine the logarithmic dependency of the gain and of the predistortion coefficients. These factors may be described as shown below (using the operating temperature change example from FIGS. 1-3 above):

$$v\_factor = v\_basis^{\left(\frac{T-T_0}{10}\right)}$$

$$v\_basis = 0.951$$

$$v\_factor = e^{v\_const(T-T_0)}$$

$$v\_const = \ln(v\_basis)/10 = -0.00502$$

respectively:

$$g\_factor = \sqrt{g\_basis^{\left(\frac{T-T_0}{10}\right)}}$$

$$g\_basis = 1.137$$

$$g\_factor = e^{g\_const(T-T_0)}$$

$$g\_const = \ln(g\_basis)/20 = 0.00642$$

Alternately, other bases may be used, leading to other formulas, in alternate implementations. The values of the fixed numbers and of the basis mentioned are examples for a particular power amplifier and may be different for other types of amplifiers. Further, other amplifiers may have different dependencies on different operating conditions.

In an alternate embodiment, a Taylor series approximation (or other adequate function) may be used to provide a reasonable approximation of the small signal gain (g_factor 406) and nonlinearity (v_factor 408) scaling factors described herein. This may be useful in the case, for example, that the digital circuitry used in the terminal device is less capable of efficiently executing the logarithmic calculations.

Figure 5:
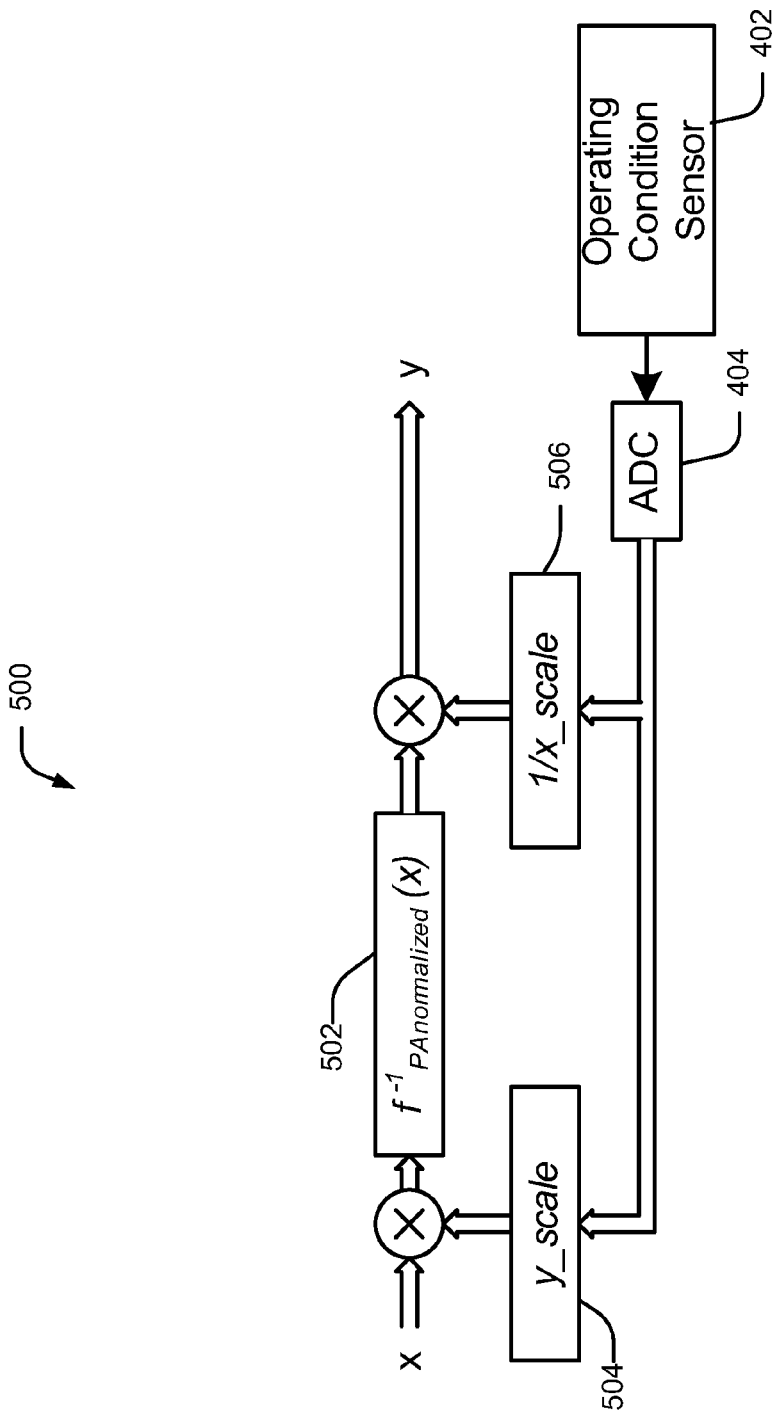
FIG. 5 is a block schematic illustrating compensation of the operating conditions in a polynomial based predistortion system using the inverse PA characteristics.

Alternately, a predistortion system 500, as illustrated in FIG. 5 (modulation and transmission stage 412 is not shown), may be used for predistortion that uses the inverse of the power amplifier characteristics of the power amplifier 422 of FIG. 4.

The system 500 of FIG. 5 is shown receiving an input signal x. Operating condition sensor 402 (e.g., temperature sensor, etc.) detects changes to the operating conditions of the system 500, and sends a signal (by way of analog to digital converter (ADC) 404) that produces a gain correction y_scale 504 and a nonlinearity correction 1/x_scale 506 for the system 500. The signal sent by the operating condition sensor 402 may be a constant multiplier or the like, depending on the implementation. In alternate implementations, gain correction y_scale 504 and nonlinearity correction 1/x_scale 506 are determined based on pre-knowledge of the operating conditions (e.g., knowledge of the duty cycle of the input signal x), or other means (e.g., other input devices, predetermination, by design, etc.).

The y_scale 504 is applied to the input signal x and additional scaling with 1/x_scale 506 scales the small signal gain of the input signal x. The scaled input x is then modified by the predistortion function 502, which compensates for the nonlinear characteristics of an operating condition change. The output of the predistortion function 502 is combined with the 1/x_scale 506, producing a predistorted signal y. In an example implementation, the 1/x_scale 506 is multiplied to a component of the output of the predistortion function 502, producing the predistorted signal y. In alternate implementations, the 1/x_scale 506 is applied to a component of the output of the predistortion function 502 by other techniques to produce the predistorted signal y (e.g., with a mixer, a combiner, etc.). The additional scaling provided by 1/x_scale 506 ensures the correct predistortion to compensate for the nonlinear characteristics at the operating condition detected by operating condition sensor 402 (or known due to pre-knowledge of the operating conditions, predetermination, etc.).

The predistorted signal y is then provided to the modulation and transmission stage 412 (not shown) to be modulated and transmitted as described above.

Look-Up-Table (LUT) Based Predistortion Systems

Figure 6:
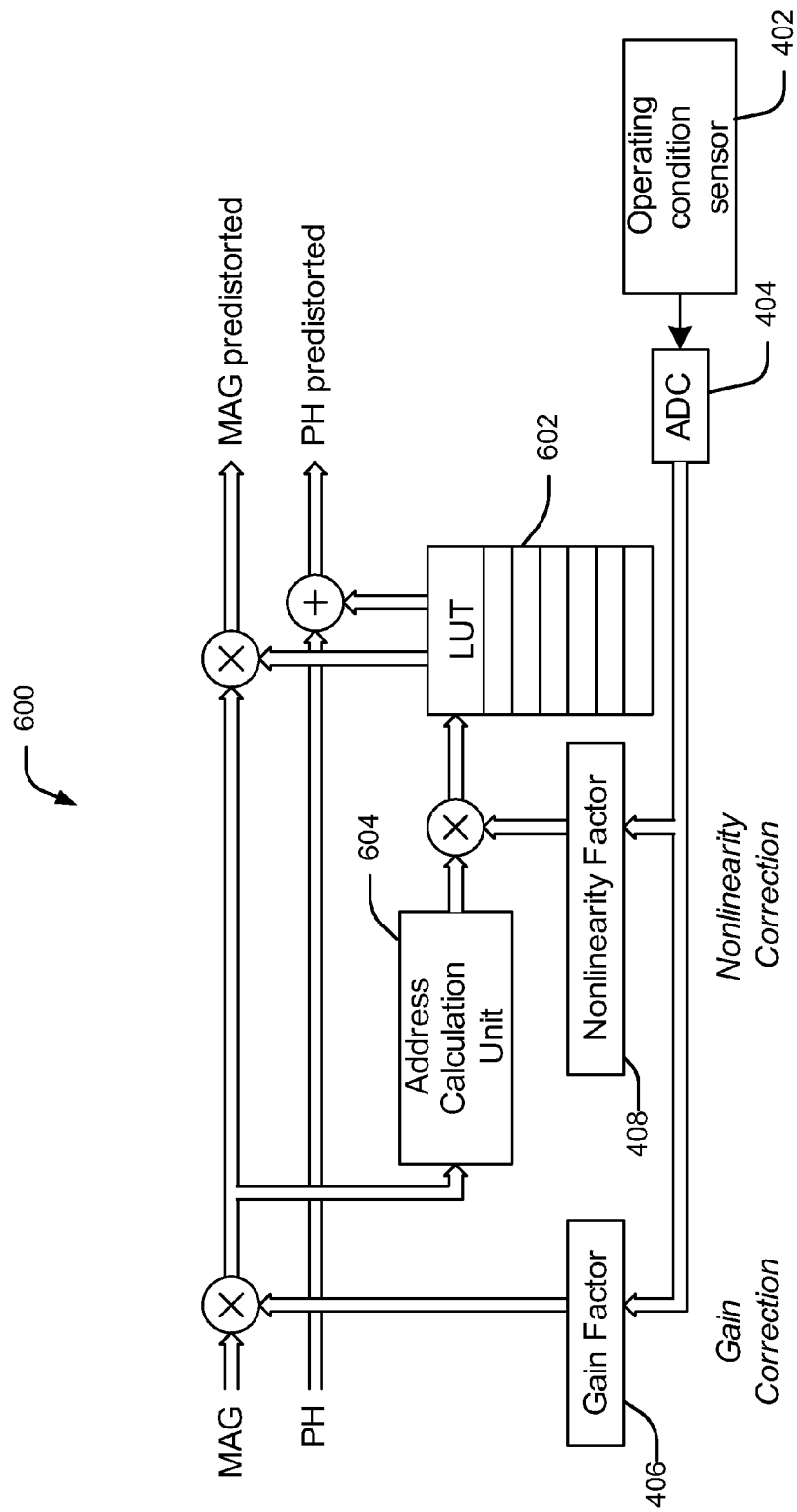
FIG. 6 is a block schematic of a look up table (LUT) based predistortion system, in a polar implementation, based on usage of defined scaling rules.

In another implementation illustrated in FIG. 6 (system 600), a look-up-table (LUT) based approach is used to implement the predistortion function 410 discussed above. The LUT based approach uses scaling coefficients corresponding to the detected operating conditions, where the scaling coefficients are discrete entries stored in a look up table 602. For example, in the system 600, discrete entries in the LUT 602 replace output values of the function $f_{predistortion}(x)$ of system 400. Instead of using an output of the function, $f_{predistortion}(X)$, the discrete entries are used in modifying (predistorting) the scaled input. The discrete entries in the LUT 602 are addressed using the address calculation unit 604, with the addresses being based on the variable input from the operating condition sensor 402, and the static nonlinearity characteristic (factor) 408.

It is noted that in alternate implementations of any of the predistortion systems disclosed herein, the inputs may be complex or polar values. In such a polar based system, the complex input signals may be represented by amplitude and phase inputs as shown in FIG. 6. The illustration of system 600 shows a magnitude (amplitude) input signal MAG and a corresponding magnitude output signal MAG predistorted, where MAG predistorted is the magnitude output of the predistortion system 600 and an input to the modulation and transmission stage 412 (not shown). Additionally, the illustration of system 600 shows a phase input signal PH and a corresponding phase output signal PH predistorted, where PH predistorted is the phase output of the predistortion system 600 and another input to the modulation and transmission stage 412.

Referring to FIG. 6, the input amplitude signal MAG is scaled by the gain factor 406. The scaled input signal MAG is then received by the address calculation unit 604. The address calculation unit 604 outputs an address for look up table (LUT) 602 based on the value of the scaled input signal MAG. The address output from address calculation unit 604 is scaled by the nonlinearity factor 408 prior to being received by the LUT 602. As a result, a scaling function value is output from the LUT 602 based on the value of the scaled MAG signal, and the nonlinearity factor 408.

Determining one single nonlinear characteristic for a given value of an operating condition, such as a given temperature, allows determination of the nonlinear characteristics at other values of the operating condition, such as additional temperatures. Thus, the LUT 602 may be populated with fixed entries or populated using values derived from a fixed predistortion polynomial to control the system 600 over the full range of an operating condition (e.g., range of temperature values). Thus, only the address output from address calculation unit 604 for selecting the predistortion coefficients from the LUT 602 (or the dependent variable of the polynomial) needs modification by the nonlinearity factor 408. Accordingly, the scaled amplitude input signal MAG and the phase input signal PH are modified based on the predistortion coefficients output from the LUT 602.

The scaled signals MAG and PH are then modified by the output of the LUT 602, producing MAG predistorted and PH predistorted as shown in FIG. 6. MAG predistorted and PH predistorted are received by the modulation and transmission stage 412, where they are modulated, amplified and transmitted in their predistorted state. In this way the nonlinear characteristics of the current operating conditions may be mitigated.

Figure 7:
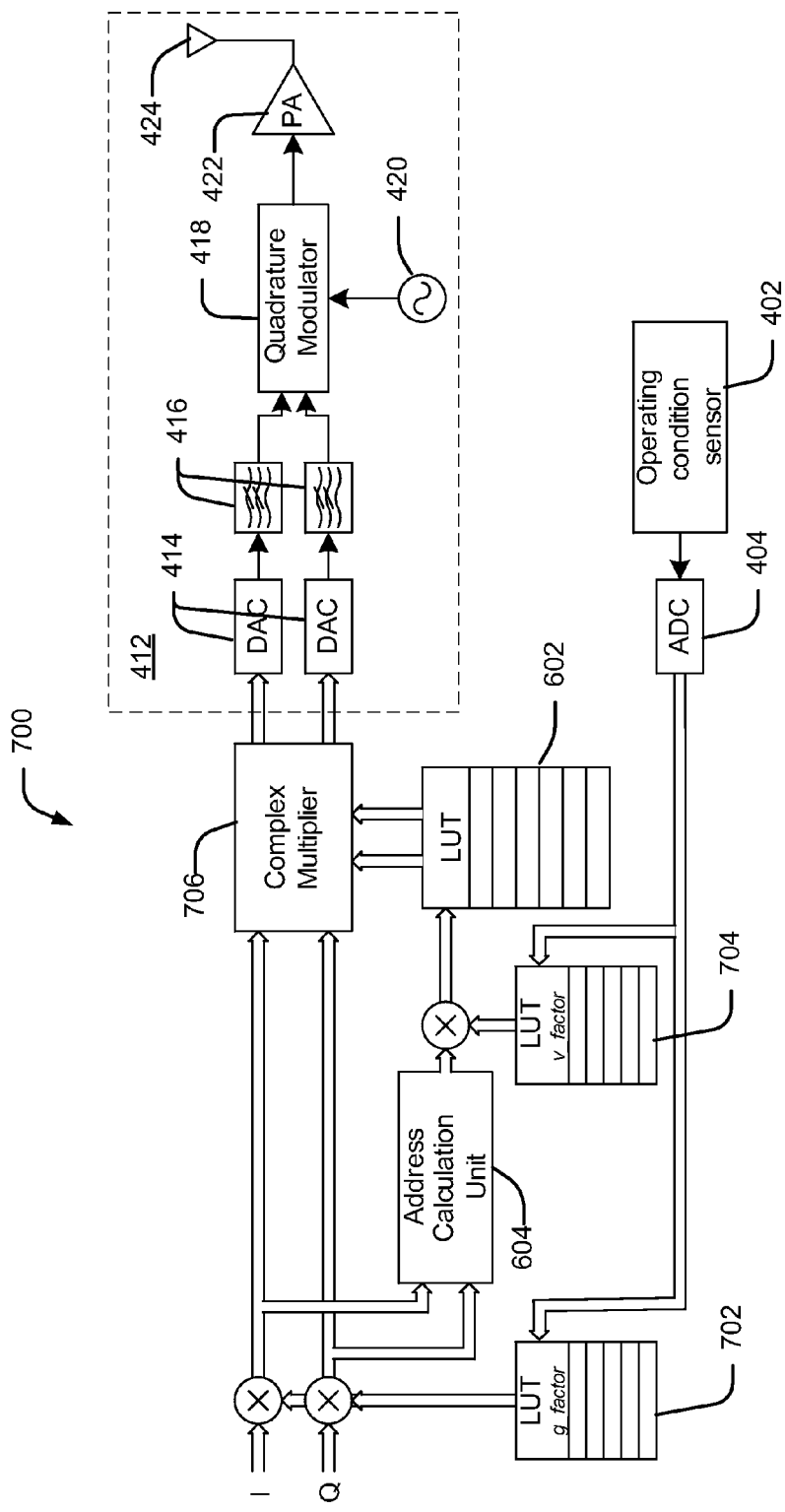
FIG. 7 is a block schematic illustrating a LUT based digital predistortion system with compensation of the impact of changing operating conditions using LUTs for description of the small signal gain and nonlinearity factors.

Alternately or additionally, look up tables may be used to fulfill gain correction and/or nonlinearity correction, as shown in FIG. 7. In the implementation of system 700 shown in FIG. 7, gain correction is provided by LUT 702 and non-linear correction is provided by LUT 704. In some implementations, the operating condition sensor 402 provides a signal, which, after conversion to a digital address by the ADC 404, provides addressing to the LUTs 702 and 704. Thus, the LUTs 702 and 704 provide scaling factors to modify input signals (here shown as generic input signals I and Q) in a manner similar to that described above with reference to FIGS. 4-6.

The scaled signals I and Q are then received by a complex multiplier 706, where they are further scaled based on the output of the LUT 602. Predistorted signals I and Q are then output from the complex multiplier 706 and received by the modulation and transmission stage 412.

FIG. 7 gives further examples of general components of the modulation and transmission stage 412. As illustrated in the example of FIG. 7, a digital to analog converter (DAC) 414 converts each signal output from the complex multiplier 706 to analog form. The analog signals then pass through one or more low pass filters 416 prior to modulation. A quadrature modulator 418, fed a carrier signal by an oscillator 420, modulates the signals onto the carrier signal producing an output modulated signal, after which the output modulated signal is amplified by power amplifier (PA) 422 and transmitted by way of antenna 424. These components are example modulation and transmission stage 412 components, and are not specific to an implementation of predistortion techniques. Any similar components may be used for a modulation and transmission stage 412.

Simplified Predistortion Systems

In some implementations of predistortion systems, it is not necessary for predistortion to be applied to compensate for the impact of operating condition changes (e.g., battery voltage, frequency range, etc.) on both gain and nonlinearity. For example, predistortion systems may be applied to compensate for gain or nonlinearity. In particular, when variations of small signal gain due to changing operating conditions could be tolerated, or may be compensated for in some other way, there might be no additional need for compensating for the gain effects using the predistortion methods described with respect to FIGS. 4-7. In another case, for example, if the amplifier is operated at lower output power, the behavior of the amplifier may be already sufficiently linear, relieving the need for non-linearity compensation.

Figure 8:
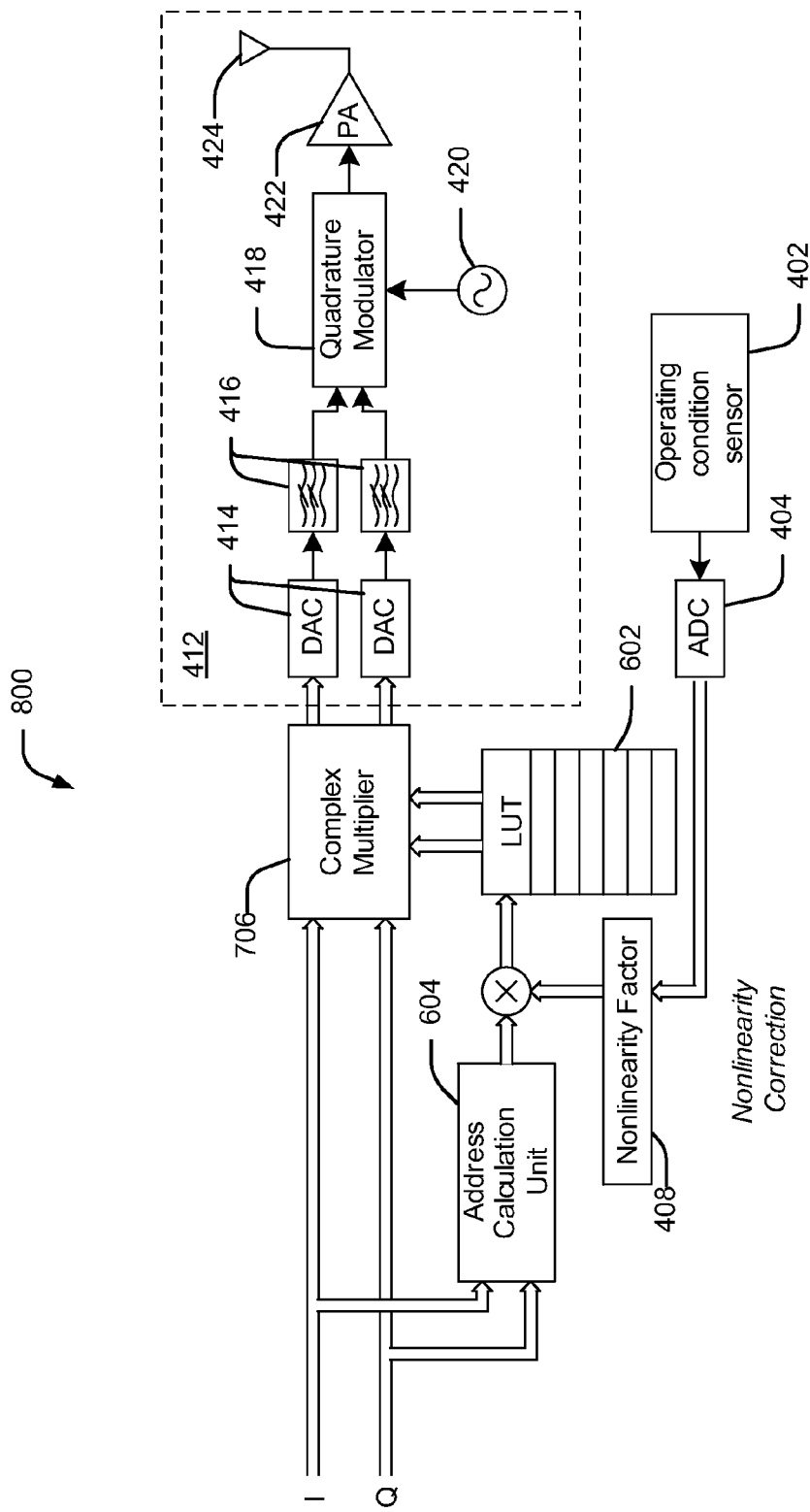
FIG. 8 is a block schematic illustrating a LUT based predistortion system configured to compensate nonlinearity impacts of changing operation conditions.

In an illustrative implementation, shown in FIG. 8, the path for compensation of small signal gain may be dropped or deactivated. FIG. 8 shows an example of how a system from FIGS. 4-7 could be simplified, by removing small signal gain correction functionality.

The system 800 of FIG. 8 is shown receiving input signals I and Q. Operating condition sensor 402 (e.g., temperature sensor, etc.) detects changes to the operating conditions of the system 800, and sends a signal (by way of ADC 404) that produces a nonlinearity factor 408 for the system 800. The signal sent by the operating condition sensor 402 may be a constant multiplier or the like, depending on the implementation.

The nonlinearity factor 408 is applied to an output of the address calculation unit 604, for example, to determine an address for LUT 602 based on the value of the input signals I and Q. The address output from address calculation unit 604 is scaled by the nonlinearity factor 408 prior to being received by the LUT 602. As a result, a scaling function value is output from the LUT 602 based on the value of the input signals I and Q, and the nonlinearity factor 408. The additional scaling provided by the nonlinearity factor 408 is based on nonlinear characteristics of the operating conditions detected by operating condition sensor 402.

The input signals I and Q are then modified by the output of the LUT 602 using a complex multiplier 706. The modification produces predistorted signals that are prepared to be received by the modulation and transmission stage 412, where they are modulated, amplified and transmitted in their predistorted state. In this way the nonlinear characteristics of the current operating conditions may be mitigated.

Figure 9:
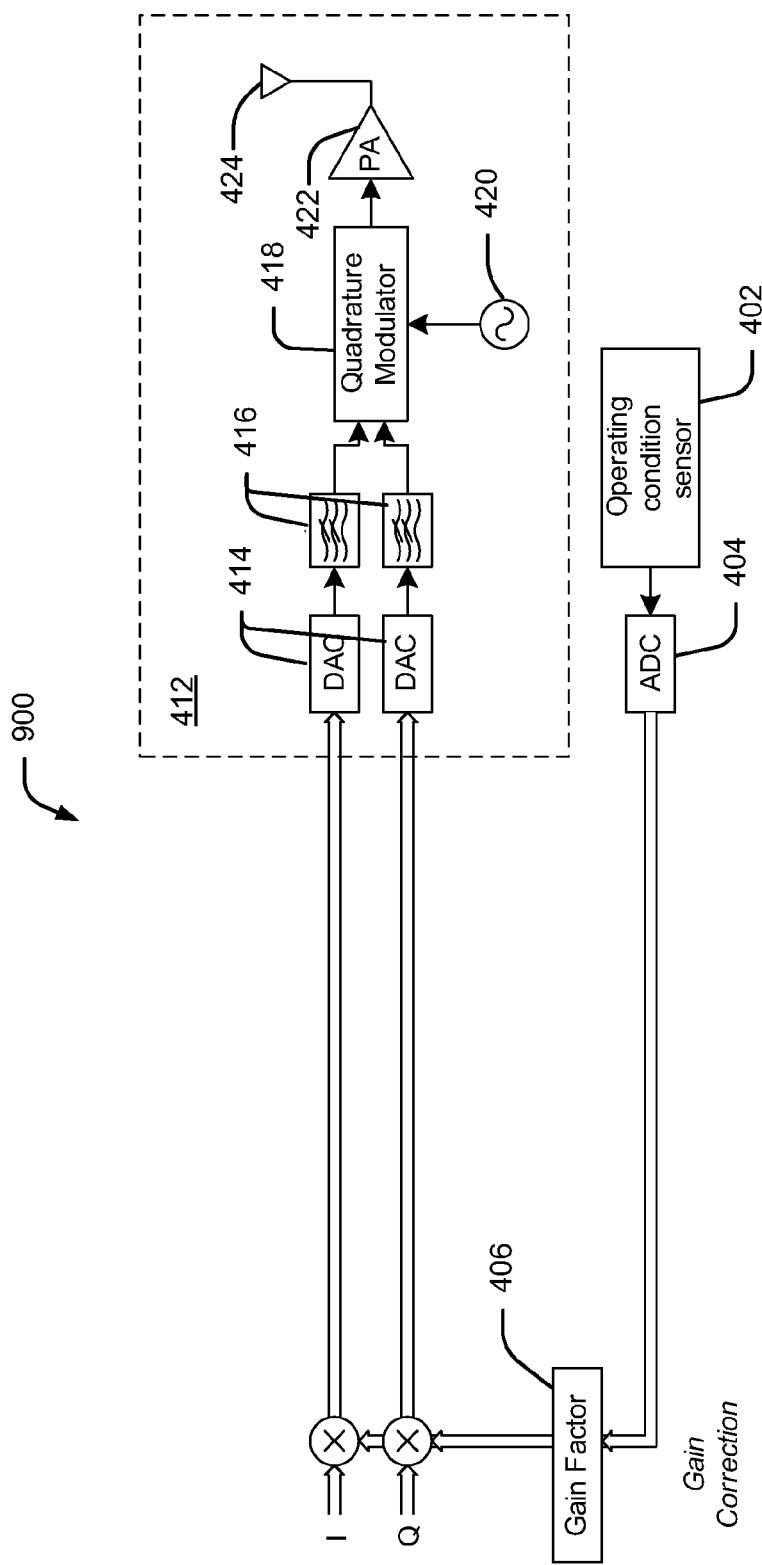
FIG. 9 is a block schematic illustrating a predistortion system configured to compensate impacts of changing operating conditions on gain.

In an alternate implementation, as shown in FIG. 9, the path for compensation of nonlinearity could be dropped or deactivated. It may be that linearity is already fulfilled by the amplifier, for example.

FIG. 9 shows an example of how a predistortion system from FIGS. 4-7 could be simplified, by removing one or more components utilized to provide nonlinearity correction when, for example, the amplifier operates in the linear region. System 900 of FIG. 9 illustrates a predistortion system using only the gain compensation path.

The system 900 of FIG. 9 is shown receiving input signals I and Q. Operating condition sensor 402 (e.g., temperature sensor, etc.) detects changes to the operating conditions of the system 900, and sends a signal (by way of ADC 404) that produces a gain factor 406 for the system 900. The signal sent by the operating condition sensor 402 may be a constant multiplier or the like, depending on the implementation, where the gain factor may be calculated based on the constant multiplier.

The gain factor 406 is applied to scale the input signals I and Q, in preparation for the modulation and transmission stage 412, where they are modulated, amplified and transmitted in their predistorted state. In this way the gain characteristics of the current operating conditions may be mitigated.

In alternate implementations, additional paths may be added to the systems 800 and/or 900 to consider additional effects of operating condition changes. In another implementation, both (gain and nonlinearity) paths are present in a predistortion system, with or without other additional paths. One or more switches (not shown) may be implemented in hardware, firmware, or software in the predistortion system, whereby one or more paths may be removed or cut off as desired. In alternate implementations, the switch(es) may be operated manually, automatically, locally, remotely, and the like. For example, in one implementation, a sensor may be used to trigger the one or more switches to activate or deactivate one or more paths based on the whether the amplifier is operating in the linear region of its power curve, for example. One having skill in the art will recognize many variations employing switching techniques on various implementations.

Predistortion Systems Including a Feedback Loop

Figure 10:
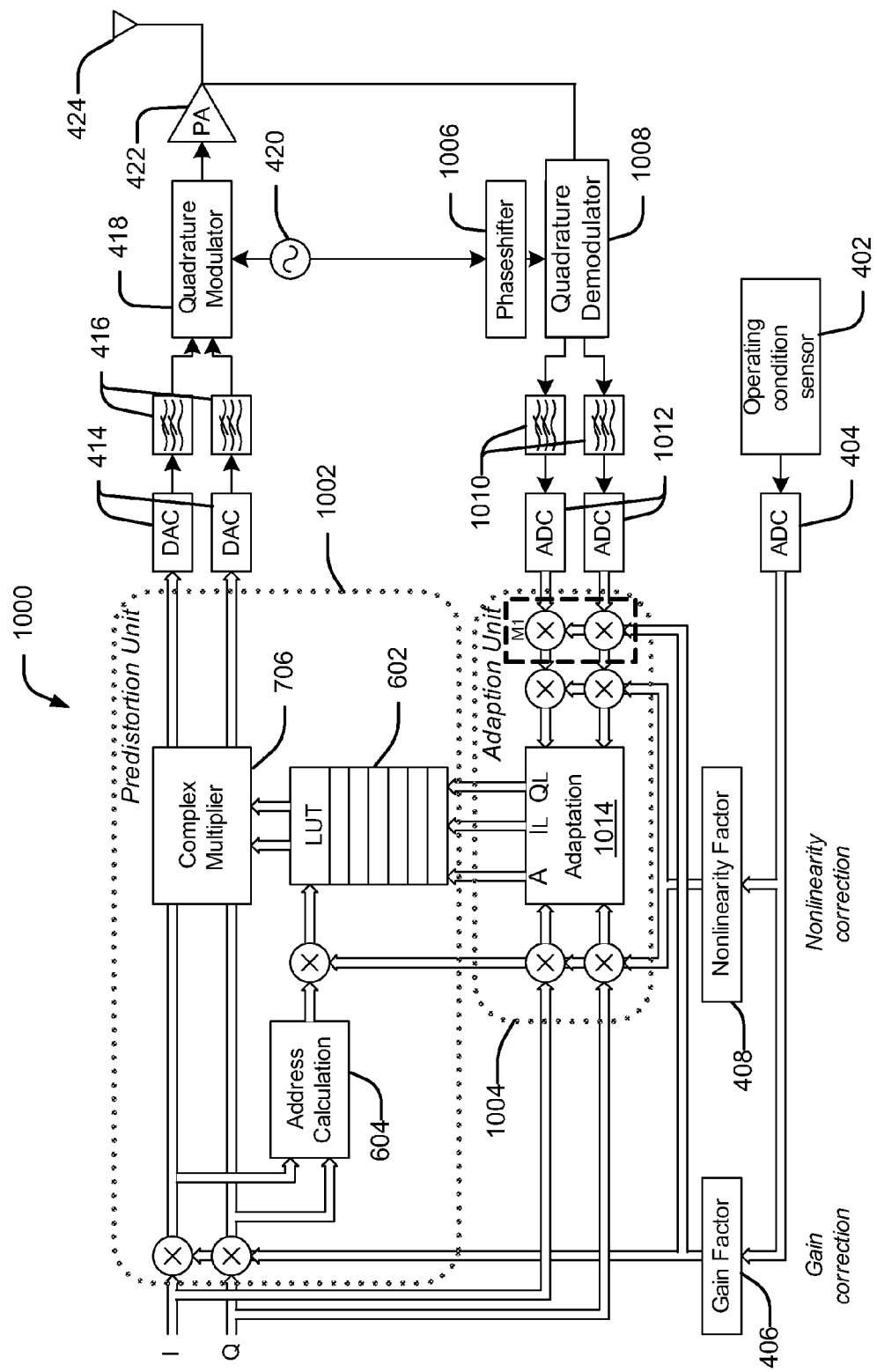
FIG. 10 is a block schematic illustrating a transmitter system with feedback loop and adaptive LUT based predistortion system for compensation of the impacts of changing operating conditions.
Figure 11:
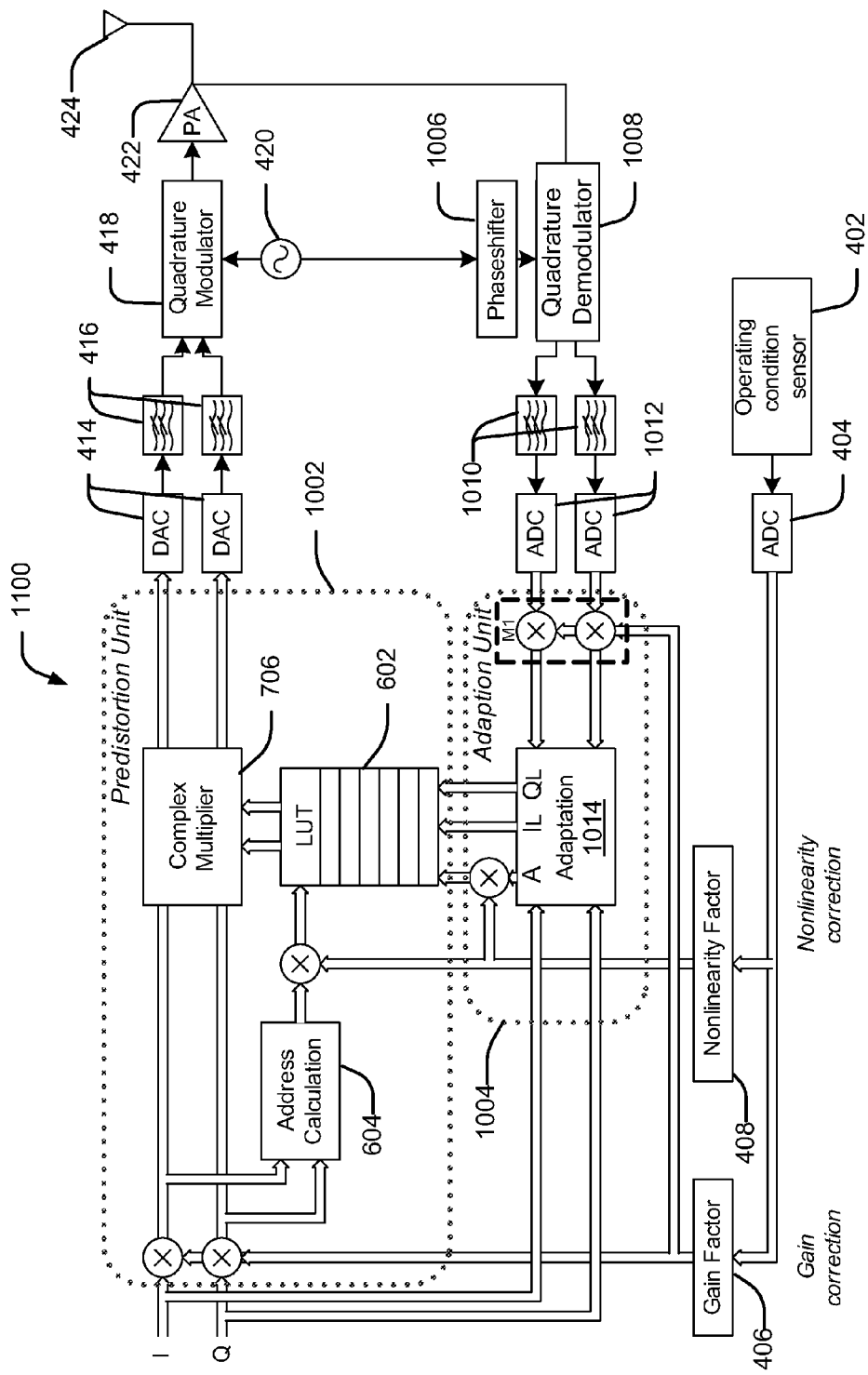
FIG. 11 is a block schematic illustrating a variant of FIG. 10 which uses nonlinearity scaling at LUT address renewal.

As illustrated in FIGS. 10 and 11, predistortion systems may be implemented with a feedback loop to compensate for the impacts of changing operating conditions. As described above, calculating the predistortion function or determining the LUT entries includes modifying the input and/or the output signals such that the impact of changing operating conditions is mitigated or eliminated. This is achieved by scaling the input and/or the output power with the respective scaling factors.

FIGS. 10 and 11 show implementations of LUT based predistortion systems 1000 and 1100 respectively, with feedback loops. The concepts of these implementations are similar to those of FIGS. 4-7, and may be similarly applied to other adaptive predistortion systems that allow scaling of input and/or output signal power.

The system 1000 of FIG. 10 operates similarly to systems 400-700 described with respect to FIGS. 4-7. The example of system 600 described in FIG. 6 may be used to describe the general system operation. In addition, however, system 1000 includes a feedback loop that impacts the populated values (entries) of the LUT 602. The modulated and amplified output signal that is output from the power amplifier (PA) 422, is fed back, where it may cause the values in the LUT 602, that are used to modify the scaled baseband input signals (here I and Q), to be repopulated.

The modulated output signal is first demodulated, for example, by way of oscillator 420 and phase shifter 1006, in conjunction with a quadrature demodulator 1008. Other demodulation components may be used in alternate implementations. Then, the demodulated output signal is filtered with filters 1010 and converted to a digital signal with analog to digital converter pair 1012. The digital signal is combined with the output of the operating condition sensor 402 (using ADC 404), gain factor 406, and nonlinearity factor 408 at the adaptation component 1014. The populated values of the LUT 602 may be renewed based on the outputs of the adaptation component 1014, which include address values for the LUT 602 (represented by "A" in FIGS. 10 and 11), and baseband signals "$I_L$" and "$Q_L$" (as shown in FIGS. 10 and 11). Accordingly, using a feedback loop may result in a renewed set of populated values (entries) in the LUT 602, which provide modification to scaled input signals I and Q at the complex multiplier 706. This feedback loop provides for an additional impact of the operating condition sensor 402, the gain 406 and nonlinearity 408 factors, as well as the modulated and amplified output, in mitigating the nonlinear effects of operational condition characteristics.

A simplification of systems having separated predistortion units 1002 and adaptation units 1004 like the ones shown in FIGS. 10 and 11 can be achieved. In the case of system 1000, it is possible to perform adaptation without compensation of nonlinearities; however, scaling of nonlinearity is required during the update of the predistortion blocks. In the case of a LUT based implementation, this can be done by modifying the addresses (represented by the "A" output from the Adaptation component 1014). The addresses ("A") may be modified by the nonlinearity factor when the values (entries) populating the LUT 602 are renewed as shown in the system 1100 of FIG. 11. In one implementation, the values ($I_L$ and $I_Q$) are renewed using calculations by a processor, with the entries (the LUT 602) being stored in a memory device (as discussed below).

As also shown in FIG. 11, in the event that the adaptation performed within the feedback loop includes a dynamic adaptation of small signal gain, then the compensation of the small signal gain in the feedback loop can be omitted (blocks $M_1$ in FIG. 10 and FIG. 11). Consequently, the input and output signal may need only to be multiplied by the nonlinearity factor.

Example Methods

Figure 12:
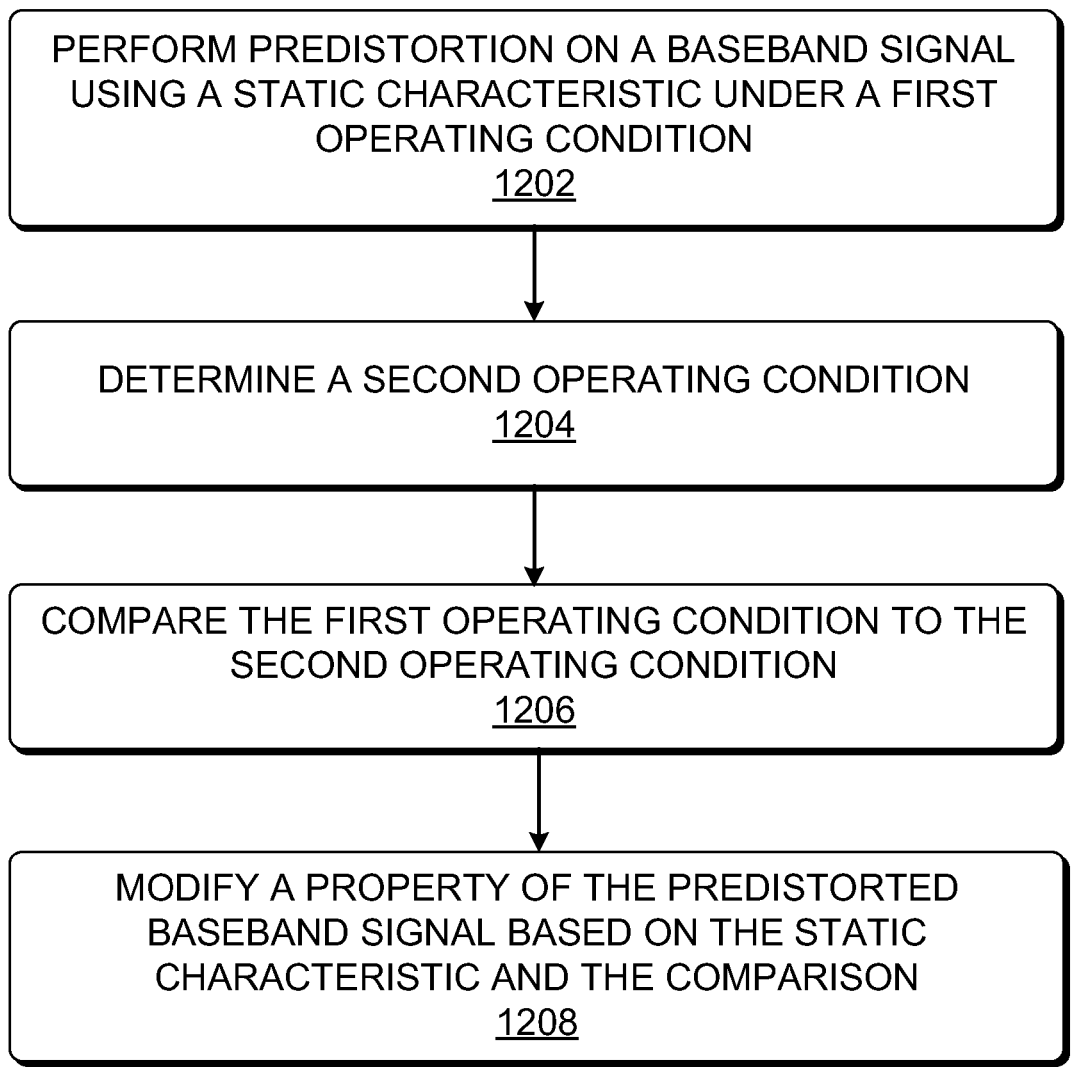
FIG. 12 is a block diagram of an exemplary method according to the present disclosure.

Exemplary methods 1200 according to the above descriptions may be illustrated as shown in FIG. 12. The exemplary methods are illustrated as a collection of blocks in a logical flow graph representing a sequence of operations that can be applied, for example, to electronic circuits. The order in which the methods are described is not intended to be construed as a limitation, and any number of the described method blocks can be combined in any order to implement the methods, or alternate methods. Additionally, individual blocks may be deleted from the methods without departing from the spirit and scope of the subject matter described herein.

At 1202, predistortion is performed on a baseband signal using a static characteristic under a first operating condition. The first operating condition may include one or a combination of a particular: temperature, supply voltage, operating frequency, load condition, bias setting, or the like.

In one implementation, at least one property of the baseband signal may be scaled based on the first operating condition. For example, the magnitude and/or the phase of the baseband signal may be scaled. In other implementations, other properties of the baseband signal may be scaled (e.g., a linear region of the baseband signal and/or a nonlinear region of the baseband signal). In alternate implementations, predistortion of the baseband signal may include other modifications to the baseband signal, where the modifications are based on the first operating condition.

In alternate implementations, the predistortion is performed on the baseband signal based on a calculated value, a predetermined value, a value in a look up table, and the like.

At 1204, a second operating condition is determined. In one implementation, the second operating condition may be determined based on an operating condition sensor (e.g., temperature sensor, supply voltage level sensor, etc.), for example the operating condition sensor 402 from FIG. 4. In another implementation, the second operating condition may be determined based on pre-knowledge of the operating conditions (e.g., knowledge of the duty cycle of the input signal x or the operating (carrier) frequency of the modulated output signal). In other implementations, the second operating condition may be determined by some other means (e.g., other input devices, predetermination, by design, etc.). The second operating condition may include one or a combination of a particular: temperature, supply voltage, operating frequency, load condition, bias setting, or the like.

At 1206, the first operating condition is compared to the second operating condition. A change in operating conditions may be determined based on the comparison.

At 1208, at least one property of the predistorted baseband signal (from block 1202) is modified based on the static characteristic and the comparison (from block 1206) of the first operating condition to the second operating condition.

In one implementation, a property of the predistorted baseband signal may be scaled or further scaled based on the second operating condition. For example, the magnitude and/or the phase of the predistorted baseband signal may be scaled or re-scaled. In other implementations, other properties of the predistorted baseband signal may be scaled or re-scaled (e.g., a linear region of the baseband signal and/or a nonlinear region of the baseband signal). In alternate implementations, predistortion of the predistorted baseband signal may include other modifications to the baseband signal, where the modifications are based generally on the second operating condition, or particularly on the change in operating conditions.

In alternate implementations, the predistortion is performed on the predistorted baseband signal based on a calculated value, a predetermined value, a value in a look up table, and the like.

Examples of Beneficial System Implementations

In principle, the open loop digital predistortion techniques described herein enable reaching the achievable performance limits of given amplifier systems over a range of operating conditions, such as temperature, voltage supply, biasing, frequency range and load impedance. In particular, these techniques can be utilized to predict and accurately describe the impact of changes in operating conditions. In this way, the performance margins inherent in previous designs could be considerably reduced.

The usefulness of the techniques explained herein has been described with respect to the impact of temperature change nonlinearities. The disclosed systems, techniques, and methods will also work for mitigating the effects of voltage supply changes and varying of load impedances.

For example, exemplary implementations of the techniques described herein may be used in instances in which it is otherwise difficult to compensate the impact of load impedance changes, and where scaling may be effective. With judicious tuning of the amplifier, the disclosed techniques may be applied to improve the effects of some load changes, either alone or in combination with other methods (e.g., isolators, hybrids, tuneable matching circuits, etc.). The load impedance change of a terminal device occurring in normal use is generally low at the transceiver output, improving the opportunities for successful application of the techniques described. Examples of useful implementations include:

(1) The techniques disclosed herein may be used to reduce the current consumption of a transceiver output stage by improving the linearity of the output of the transceiver output stage. The advantages may include an increase in the bandwidth of the respective transceiver output stage. Additionally, the number of signal standards (e.g. GSM, CDMA, etc.) that may be covered by the transceiver output stage may also increase.

(2) The techniques disclosed herein may also be used in systems with load insensitive power amplifiers. This may be achieved by using isolators or circulators or designs with 90° hybrids. The disclosed techniques may be used to replace a complex RF feedback loop at the output of an amplifier.

System Calibration Issues

In some systems described herein, calibration may not be required to accommodate the impact of sample variations. Herein, "sample variations" refers to a number of different devices utilizing similar transmission circuitry (e.g., application in a number of different mobile telephone models). Data associated with each of the different devices could be used instead, leading to improved performance in each model. For example, similar transceiver designs may be used with multiple terminal models, each having similar predistortion systems, and discrete data may be populated into look up tables within the devices, where the discrete data is specific to the device model.

In particular, using the techniques disclosed herein has the advantage that the complexity of device description may be extremely reduced. Instead of requiring a high number of discrete values for each device description, a few continuous characteristics can be derived for a typical sample device. For samples that are statistically near the limits of typical devices, additional characteristics may be obtained. In one implementation, a class may be defined that incorporates the additional characteristics, where each sample in the class may be expected to be described by characteristics of similar shape. By studying the characteristics of statistically selected samples, additional knowledge of the characteristics can be derived. This should make a reasonably accurate and fast determination of specific characteristics of samples possible by measuring a few points during fabrication, calibration, or when powering-on the device.

Exemplary Environment

Figure 13:
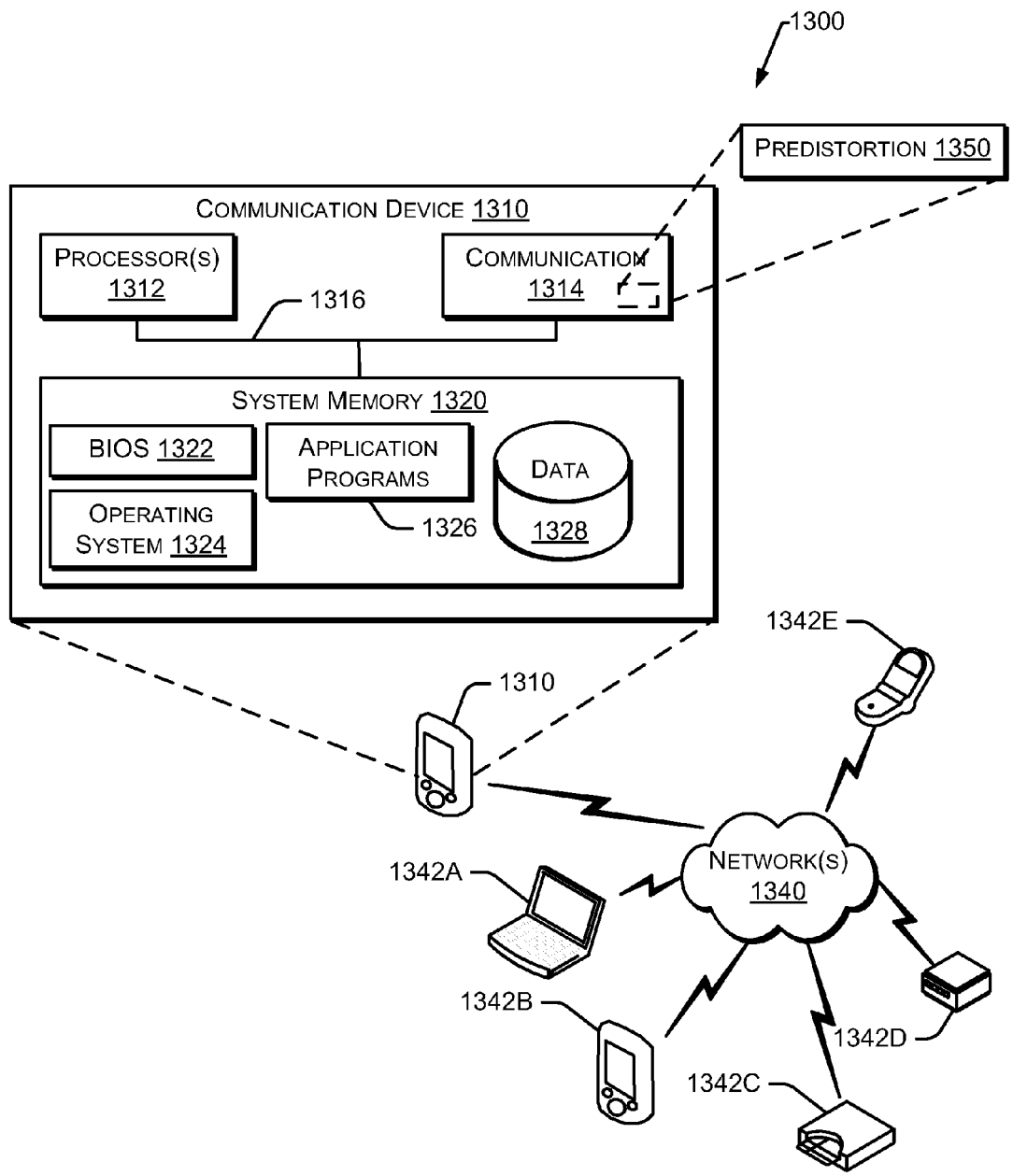
FIG. 13 is an exemplary environment in which techniques in accordance with the present disclosure may be implemented.

FIG. 13 illustrates an exemplary environment 1300 in which techniques in accordance with the present disclosure may be implemented. In this implementation, the environment 1300 includes a communication device 1310, or other mobile and/or electronic device, having one or more predistortion components 1350 configured in accordance with the teachings of the present disclosure. The predistortion components 1350 may include the predistortion components and/or systems described herein with reference to FIGS. 4-12. In alternate implementations, the predistortion components 1350 may include other components and/or systems configured to perform the predistortion techniques discussed with reference to FIGS. 4-12, or the like.

The communication device 1310 operatively communicates via one or more networks 1340, such as wireless local area network (WLAN), with a plurality of other devices 1342. Alternatively, the communication device 1310 may bypass the networks 1340 and communicate directly with one or more of the other devices 1342.

In the representative environment 1300, the communication device 1310 is a hand-held device (terminal), such as a mobile telephone, a smartphone, an MP3 (Moving Picture Experts Group Layer-3) player, a personal data assistant (PDA), a global positioning system (GPS) unit, or other similar hand-held device, and the other devices 1342 may include, for example, a computer 1342A, another hand-held device 1342B, a compact disc (CD) or digital video disc (DVD) player 1342C, a signal processor 1342D (e.g., radio, navigational unit, television, etc.), and another mobile phone 1342E. In alternate implementations, of course, the devices 1310, 1342 may include any other suitable devices, and it is understood that any of the plurality of devices 1342 may be equipped with predistortion components 1350 that operate in accordance with the teachings of the present disclosure.

As further shown in FIG. 13, the communication device 1310 may include one or more processors 1312 and one or more communication components 1314, such as input/output (I/O) devices (e.g., transceivers, transmitters, receivers, etc.), coupled to a system memory 1320 by a bus 1316. In the implementation shown in FIG. 13, the predistortion component 1350 is included as a component within the communication component 1314 of the communication device 1310. In alternate implementations, however, the predistortion component 1350 may be integrated with any other suitable portion of the device 1310, or may be a separate, individual component of the device 1310. The predistortion component 1350 may be implemented in hardware, firmware, software, or any combination of the same. Further, the predistortion component 1350 may be stored in the form of computer readable instructions on a computer readable storage device such as system memory 1320 or any other type of non-transitory computer-readable media as described below.

The system bus 1316 of the communication device 1310 represents any of the several types of bus structures, including a memory bus or memory controller, a peripheral bus, an accelerated graphics port, and a processor or local bus using any of a variety of bus architectures. The communication component 1314 may be configured to operatively communicate with one or more external networks 1340, such as a cellular telephone network, a satellite network, an information network (e.g., Internet, intranet, cellular network, cable network, fiber optic network, LAN, WAN, etc.), an infrared or radio wave communication network, or any other suitable network.

The system memory 1320 may include computer-readable media configured to store data and/or program modules for implementing the techniques disclosed herein that are immediately accessible to and/or presently operated on by the processor 1312. For example, the system memory 1320 may also store a basic input/output system (BIOS) 1322, an operating system 1324, one or more application programs 1326, and program data 1328 that can be accessed by the processor 1312 for performing various tasks desired by a user of the communication device 1310.

Moreover, the computer-readable media included in the system memory 1320 can be any available media that can be accessed by the communication device 1310, including computer storage media and communication media. Computer storage media may include volatile and non-volatile, removable and non-removable media implemented in any method or technology for storage of information such as computer-readable instructions, data structures, program modules, or other data. Computer storage media includes, but is not limited to, and random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, including paper, punch cards and the like, which can be used to store the desired information and which can be accessed by the communication device 1310.

Similarly, communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection and wireless media such as acoustic, RF, infrared and other wireless media. Combinations of any of the above should also be included within the scope of computer readable media.

Generally, program modules executed on the device 1310 (FIG. 13) may include routines, programs, objects, components, data structures, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the exemplary environment 1300 is shown in FIG. 13 as a communication network, this implementation is meant to serve only as a non-limiting example of a suitable environment for use of a predistortion component 1250 in accordance with present disclosure. Similarly, the device 1310 is simply one non-limiting example of a suitable device that may include a predistortion component 1350 in accordance with the present disclosure.

Conclusion

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. Accordingly, the scope of the invention should not be limited by the disclosure of the specific implementations set forth above. Instead, the invention should be determined entirely by reference to the claims that follow.

What is claimed is:

1. A method comprising:
   performing predistortion on a baseband signal using a static characteristic under a first operating condition to produce a predistorted baseband signal;
   determining a second operating condition;
   comparing the first operating condition to the second operating condition; and
   modifying a property of the predistorted baseband signal based on the static characteristic and the comparison of the first operating condition to the second operating condition by scaling a linear gain component and/or a nonlinear component of the baseband signal, wherein comparing the first operating condition to the second operating condition results in determining a difference in one or more of the following: temperature, supply voltage, operating frequency, load condition, or bias setting;

determining an operating condition characteristic based on the comparison of the first operating condition to the second operating condition;

determining a single static nonlinear function that represents the operating condition characteristic;

scaling the single static nonlinear function by a constant based on the comparison of the first operating condition to the second operating condition; and modifying the property of the predistorted baseband signal based on the scaled single static nonlinear function.

2. The method of claim 1, further comprising performing predistortion on a magnitude component and/or a phase component of the baseband signal.

3. The method of claim 2, further comprising scaling the magnitude component and/or the phase component of the baseband signal.

4. The method of claim 2, further comprising modifying the magnitude component and/or the phase component of the baseband signal based on a value listed in a look up table, wherein the value is addressed in the lookup table based on the static characteristic.

5. The method of claim 1, further comprising modifying the property of the predistorted baseband signal based on a value listed in a look up table, wherein the value is addressed in the lookup table based on a feedback signal comprising a modulated output signal.

* * * * *